(12) United States Patent
Sakai et al.

(10) Patent No.: US 6,380,796 B2
(45) Date of Patent: *Apr. 30, 2002

(54) SEMICONDUCTOR POWER CONVERTING APPARATUS

(75) Inventors: Hiromitsu Sakai; Hidetoshi Aizawa; Shuji Katoh; Ryuji Iyotani; Masahiro Nagasu, all of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/838,470

(22) Filed: Apr. 20, 2001

Related U.S. Application Data (63) Continuation of application No. 09/642,816, filed on Aug. 22, 2000.

(30) Foreign Application Priority Data

Nov. 5, 1999 (JP) .......................................... 11-314734

(51) Int. Cl.[7] ............................................. H03K 17/687
(52) U.S. Cl. ...................................... 327/434; 327/427
(58) Field of Search ................................. 327/427, 430, 327/431, 434, 435

(56) References Cited

U.S. PATENT DOCUMENTS 4,303,841 A  12/1981 Baker
5,523,714 A  * 6/1996 Topp et al. ................. 327/427
6,054,890 A  4/2000 Giacomo

FOREIGN PATENT DOCUMENTS

| EP | 0730331  | 9/1996 |
|---|---|---|
| JP | 06209580 | 7/1994 |
| JP | 07067320 | 3/1995 |
| JP | 11178318 | 7/1999 |
| JP | 11-178318 | 7/1999 |
| JP | 11262243 | 9/1999 |

* cited by examiner

*Primary Examiner*—Shawn Riley
(74) *Attorney, Agent, or Firm*—Mattingly, Stanger & Malur, P.C.

(57) ABSTRACT

A semiconductor power converting apparatus includes a semiconductor element for controlling a current flowing between a collector and an emitter in response to a gate condition, a driving device connected to the gate, for driving the gate in response to a drive signal entered thereinto, a voltage applying device for applying both a forward bias and a reverse bias to the gate so as to set the emitter of the semiconductor element to a neutral potential, and a voltage dividing device for dividing a voltage appearing between the collector and the emitter of the semiconductor element, in which the drive signal is under OFF state, a voltage produced based upon the divided voltage by the voltage dividing device is applied to the gate, and the gate voltage is controlled in response to the voltage appearing between the collector and the emitter of the semiconductor element, thereby reducing the snubbed loss.

5 Claims, 8 Drawing Sheets

SEMICONDUCTOR POWER CONVERTING APPARATUS

This application is a continuation of U.S. Ser. No. 09/642,816, filed Aug. 22, 2000.

BACKGROUND OF THE INVENTION

1. Field of the Invention

The present invention relates to a semiconductor power converting apparatus with employment of a semiconductor element and the like. More specifically, the present invention relates to a semiconductor power converting apparatus capable of suppressing a peak voltage during a switching operation without requiring a snubber circuit.

2. Description of the Related Art

IGBTs (Insulated-Gate Bipolar Transistor) known as a typical insulated-gate transistor own low gate power consumption and can be switched in high speeds with a small switching loss. Accordingly, these IGBTs are employed in semiconductor power converting apparatuses having relatively medium and small capacities. Furthermore, these IGBTs are desirably applied to semiconductor power converting apparatuses having large capacities. In general, a jump-up voltage "$\Delta V$" of an IGBT having a snubber circuit is expressed by the following formula (1-1) based upon a capacitance "C" of a snubber capacitor:

$$\Delta V = 1\sqrt{L/C} \quad (1\text{-}1)$$

In other words, this jump-up voltage $\Delta V$ is direct proportional to both a switching current I and a root-mean-squared value of a wiring inductance L. Therefore, in the case that a wiring inductance L can be minimized and a switching current I is low in a semiconductor power converting apparatus having a medium/small capacity, since a switching loss $E_{off}$ of an IGBT is present, this power converting apparatus can be made in a snubberless form, namely a snubber capacitor C is omitted. However, a semiconductor power converting apparatus having a large capacity requires such a snubber circuit for suppressing a peak voltage produced when a large switching current is turned OFF, and furthermore, another snubber circuit for equally sharing a high DC voltage to series-connected semiconductor elements. Thus, switching losses of these snubber circuits would reduce the converter efficiency, namely could not be neglected. Moreover, since the snubber circuits are connected to such a semiconductor power converting apparatus, the cost thereof is increased and this semiconductor power converting apparatus becomes bulky. Also, when a large number of IGBTs are connected in series to each other, both ON timing and OFF timing of all of these IGBTs must be adjusted in high precision in order to equally sharing the voltages to these IGBTs. This requires time and high cost. As a result, very recently, various circuit systems have been proposed. In these circuit systems, the peak voltages are suppressed when the IGBTs are turned OFF. Alternatively, the stational voltage sharing operation for the series-connected IGBTs is uniformly carried out on that any snubber circuit. This recently proposed circuit system corresponds to, as described in Japanese Laid-Open Patent Application No. 11-178318, the gate driving circuit with the basic circuit arrangement such that the zener diode is connected between the collector of the IGBTs and the gate thereof, or the series circuit made of the zener diode and the resistor is connected between the collector and the gate of the IGBT.

In this known gate control circuit, the avalanche current will flow when the collector voltage of the IGBT becomes higher than, or equal to the avalanche voltage of the zener diode, and thus, since the voltage of the gate resistor is increased, the peak value of the collector voltage of this IGBT is suppressed. However, in connection with a high withstanding voltage of an IGBT itself, an avalanche voltage of a zener diode would also require several Kilovolts. Further, in order to rise up the gate voltage of the IGBT by an avalanche current, such avalanche currents having values of several to several tens of Amperes are required. In addition, a resistance value of a gate resistor would also require approximately several tens of Ohms, so that the switching loss of this IGBT would be increased.

Conventionally, when the peak voltage of the IGBT is suppressed, since the withstanding voltage of the IGBT is increased, the avalanche voltage of the zener diode connected to the collector of the IGBT must be high. Furthermore, the avalanche current of the zener diode must be increased, or the gate resistance value must be increased instead of increasing of the switching loss. As a result, there are such problems that the higher withstanding voltage of the IGBT cannot be realized, but also the switching loss is increased.

Also, in the case that a plurality of IGBTs which are simultaneously switched are connected in series to each other by employing the conventional circuit system capable of suppressing the peak voltage produced when the IGBT is turned OFF, if the characteristic fluctuations as to the respective circuit elements are not strictly selected and are not made coincident with each other, then the peak voltages produced when the plural IGBTs are turned OFF are fluctuated, and also the stationary voltage sharing conditions are fluctuated. These circuit elements are the IGBTs, the resistor, the zener diodes, and the transistors, which constitute this conventional circuit system. As a consequence, the switching frequency could not be made high.

SUMMARY OF THE INVENTION

The present invention has been made to solve the above-explained problems, and therefore, has an object to provide a semiconductor power converting apparatus capable of making an electric power converting apparatus compact and in low cost, and capable of operating the electric power converting apparatus in a high efficiency.

To solve the above-explained problems, a semiconductor power converting apparatus, according to the present invention, is featured by comprising: a semiconductor element for controlling a current flowing between a collector and an emitter in response to a gate condition; driving device connected to the gate, for driving the gate in response to a drive signal entered therinto; voltage applying device for applying both a forward bias and a reverse bias to the gate so as to set the emitter of the semiconductor element to a neutral potential; and voltage dividing device for dividing a voltage appearing between the collector and the emitter of the semiconductor element; wherein: when the drive signal is under OFF state, a voltage produced based upon the divided voltage by the voltage dividing device is applied to the gate; and the gate voltage is controlled in response to the voltage appearing between the collector and the emitter of the semiconductor element.

Also, a semiconductor power converting device, according to the present invention, is featured by that as the voltage dividing device for dividing the voltage appearing between the collector and the emitter of the semiconductor element, this voltage dividing device includes the collector and a minus-polarity terminal for applying the reverse bias voltage.

Also, a semiconductor power converting apparatus, according to the present invention, is featured by comprising; selecting device made by a switching element connected to a gate of a semiconductor element typically known as an insulating gate transistor, capable of selecting a drive signal in response to either an ON command or an OFF command issued by a control device; a voltage source for applying both a forward bias and a reverse bias to the gate while setting the emitter for driving the semiconductor element as a neutral potential; and voltage dividing device for dividing a voltage appearing between the collector of the semiconductor element and a minus-sided electrode of the voltage source by employing a resistor, in which when the drive signal is an OFF command, a gate voltage of the semiconductor element becomes such a voltage value corresponding to the voltage division; in which when the voltage appearing between the collector of the semiconductor element and the emitter thereof is higher than, or equal to a predetermined voltage, the voltage dividing device can suppress this peak voltage. With employment of this circuit arrangement, the reverse bias voltage can be applied just after the semiconductor element is turned OFF without increasing the gate resistance with being turned OFF. When the voltage between the collector and the emitter of the semiconductor element is higher than, or equal to predetermined voltage set by the voltage dividing ratio, the gate voltage is switched from the reverse bias voltage to the forward bias voltage in response to the emitter between the collector and the emitter. Furthermore, when the voltage between the collector and the emitter of the semiconductor element becomes high, the peak voltage of the voltage between the collector and the emitter is suppressed by utilizing the gate voltage of the forward bias voltage in response to this voltage between the collector and the emitter.

Also, a semiconductor power converting apparatus, according to the present invention, is featured by comprising; selecting device made by a switching element connected to a gate of a semiconductor element, capable of selecting a drive signal in response to either an ON command or an OFF command issued by a control device; a voltage source for applying both a forward bias and a reverse bias to the gate while setting the emitter for driving the semiconductor element as a neutral potential; voltage dividing device for dividing a voltage appearing between the collector of the semiconductor element and the emitter thereof, or a voltage appearing between the collector of the semiconductor element and a minussided electrode of the voltage source by employing a resistor, in which when the drive signal is an OFF command, a gate voltage of the semiconductor element is brought into such a voltage condition corresponding to the voltage division; and switching device for switching the gate voltage in such a manner that the gate voltage is equal to a negative voltage corresponding to the source voltage of the voltage source when the divided voltage detected by the voltage dividing device is lower than, or equal to a set voltage, and also the gate voltage is equal to a voltage value produced based upon the divided voltage when the divided voltage by the voltage dividing device is higher than, or equal to the set voltage; in which when the voltage appearing between the collector of the semiconductor element and the emitter thereof is higher than, or equal to a predetermined voltage, the voltage dividing device can suppress a peak voltage, whereas when the voltage between the collector and the emitter of the semiconductor element is lower than, or equal to the predetermined voltage, the reverse bias is applied to the gate.

With employment of this circuit arrangement, the reverse bias voltage can be applied just after the semiconductor element is turned OFF without increasing the gate resistance when being turned OFF. When the voltage between the collector and the emitter of the semiconductor element is higher than, or equal to predetermined voltage set by the voltage dividing ratio, the gate voltage is switched from the reverse bias voltage to the forward bias voltage in response to the emitter between the collector and the emitter. When the voltage between the collector and the emitter of the semiconductor element is lower than, or equal to a predetermined voltage, the reverse bias voltage is applied to the gate so as to increase the noise margin performance. Furthermore, when the voltage between the collector and the emitter of the semiconductor element becomes high, the peak voltage of the OFF-voltage between the collector and the emitter is suppressed by applying the gate voltage of the forward bias voltage directly proportion to this voltage between the collector and the emitter.

Also, a semiconductor power converting device, according to the present invention, is featured by comprising: a driving device connected to a gate of a semiconductor element, for applying both a forward bias and a reverse bias to the gate of the semiconductor element by employing a first switch and a second switch, the first switch series-connected to a resistor being turned ON in response to an ON command issued by a control device, and the second switch series-connected to a resistor being turned ON in response to an OFF command issued by the control device; a voltage source for applying both a forward bias and a reverse bias to the gate while setting the emitter for driving the semiconductor element as a neutral potential; voltage dividing device for dividing a voltage appearing between the collector of the semiconductor element and the emitter thereof, or a voltage appearing between the collector of the semiconductor element and a minus-sided electrode of the voltage source by employing a resistor, and for detecting a voltage appearing between the collector and the emitter of the semiconductor element; and adjusting device constituted by a third switch parallel-connected to a first switch, and a fourth switch series-connected to a second switch, for adjusting a gate signal based upon the voltage value divided by the voltage dividing device. As a result, the switching losses produced when the semiconductor element is turned ON and also turned OFF can be reduced. Also, when the voltage between the collector and the emitter of the semiconductor element is higher than, or equal to a predetermined voltage, this peak voltage can be suppressed. With employment of this circuit arrangement, in such a case that the collector current of the semiconductor element is small, the switching loss is reduced even under such a condition that the peak voltage is not substantially suppressed. In the case that the voltage between the emitter and the collector of the semiconductor element is higher than, or equal to a predetermined voltage set by a voltage dividing ratio, the gate voltage is switched from the reverse bias voltage to a bias voltage direct proportional to the forward bias voltage. Furthermore, when the voltage between the collector and the emitter of the semiconductor element becomes high, the peak voltage of the voltage between the collector and the emitter is suppressed by utilizing the gate voltage of the forward bias voltage in response to this voltage between the collector and the emitter.

Furthermore, a semiconductor power converting apparatus, according to the present invention, is featured by that either a zener diode or a voltage source is inserted in series to a voltage dividing resistor which divides a voltage appearing between an emitter and a collector of a semiconductor element so as to increase a changing ratio of a gate voltage with respect to the voltage between the emitter and the collector of this semiconductor element while a peak voltage is suppressed. As a result, the peak voltage suppressing effect is improved. With employment of the circuit arrangement, the peak voltage suppressing operation when the semiconductor element is turned OFF can be effectively carried out.

Furthermore, a semiconductor power converting apparatus, according to the present invention, is featured by that a circuit constituted by either a capacitor or a switch is connected in parallel to a portion of a voltage dividing resistor which divides a voltage appearing between a collector of a semiconductor element and an emitter thereof, and such a device is provided which changes a voltage dividing ratio in such a manner that a relationship between the gate voltage and the collector potential can be continuously, or stepwise changed, and rising of the collector potential is commenced. Then, the voltage dividing device can suppress a peak voltage appearing between the collector and the emitter by changing the setting condition even when dv/dt of the voltage between the collector and the emitter of the semiconductor element is high. With employment of this circuit arrangement, in order to increase the efficiency of the semiconductor power converting apparatus, it is possible to increase the dv/dt of the voltage between the collector and the emitter when the current of the semiconductor element is interrupted. Also, another peak voltage by charging time of the gate capacitance of the semiconductor element can be suppressed even for a high dv/dt occurred other than the current interruption of the semiconductor element.

Furthermore, a semiconductor power converting apparatus, according to the present invention, is featured by employing a device for changing a voltage dividing ratio by way of a timer switch connected in parallel to a portion of a voltage dividing resistor which divides a voltage appearing between a collector of a semiconductor element and an emitter thereof. Then, after the semiconductor element has been turned OFF, the voltage between the collector and the emitter of the semiconductor element is stationally stabilized with respect to the power supply voltage. After a preselected time period has passed, the voltage dividing ratio is changed into a higher value than the power supply voltage, so that the reverse bias can be applied to the gate of the semiconductor element. With employment of this circuit arrangement, a voltage between the collector of the semiconductor element and the emitter thereof after the peak voltage has been suppressed is stabilized to becomes such a voltage obtained by dividing the power supply voltage by a total number of series-connected elements. Thereafter, the reverse bias can be applied to the gate, so that the noise margin may be improved in order that the erroneous ON state never occurs.

Furthermore, a semiconductor power converting apparatus, according to the present invention, is featured by that more than two sets of semiconductor elements are connected in series to each other so as to constitute an arm, the arms are simultaneously turned ON, or OFF. Then, a voltage dividing ratio of a voltage dividing device is set in such a manner that the voltages between the collectors and the emitters of the respective semiconductor elements can be equally shared, so that the voltages between the collectors and the emitters of the series-connected semiconductor elements may be made equal. With employment of this circuit arrangement, in such a semiconductor power converting apparatus that a plurality of series-connected semiconductor elements are simultaneously turned ON or OFF, the peak voltage of the voltage appearing between the collector and the emitter of each of the semiconductor elements series-connected to each other can be suppressed. Also, the stationary voltage stabilizing operation after suppressing the peak voltage is carried out in a highspeed, and the switching frequency of the semiconductor power apparatus converting apparatus is increased. As a result, the power converting efficiency can be increased.

Also, a semiconductor power converting apparatus, according to the present invention, is featured by comprising: a semiconductor element for controlling a current flowing between a collector and an emitter in response to a gate condition; drive device connected to the gate, for driving the gate in response to a drive signal; bias applying device for applying both a forward bias and a reverse bias to the gate; and voltage dividing device for dividing a voltage appearing between the collector and the emitter of the semiconductor element; wherein: when the drive signal is under OFF state and also a voltage appearing between the collector and the emitter is higher than, or equal to the voltage determined by the voltage dividing means the bias applying means applies a forward bias to the gate.

BRIEF DESCRIPTION OF THE INVENTION

DESCRIPTION OF THE EMBODIMENTS

Referring now to drawings, embodiment modes of the present invention will be described.

Figure 1:
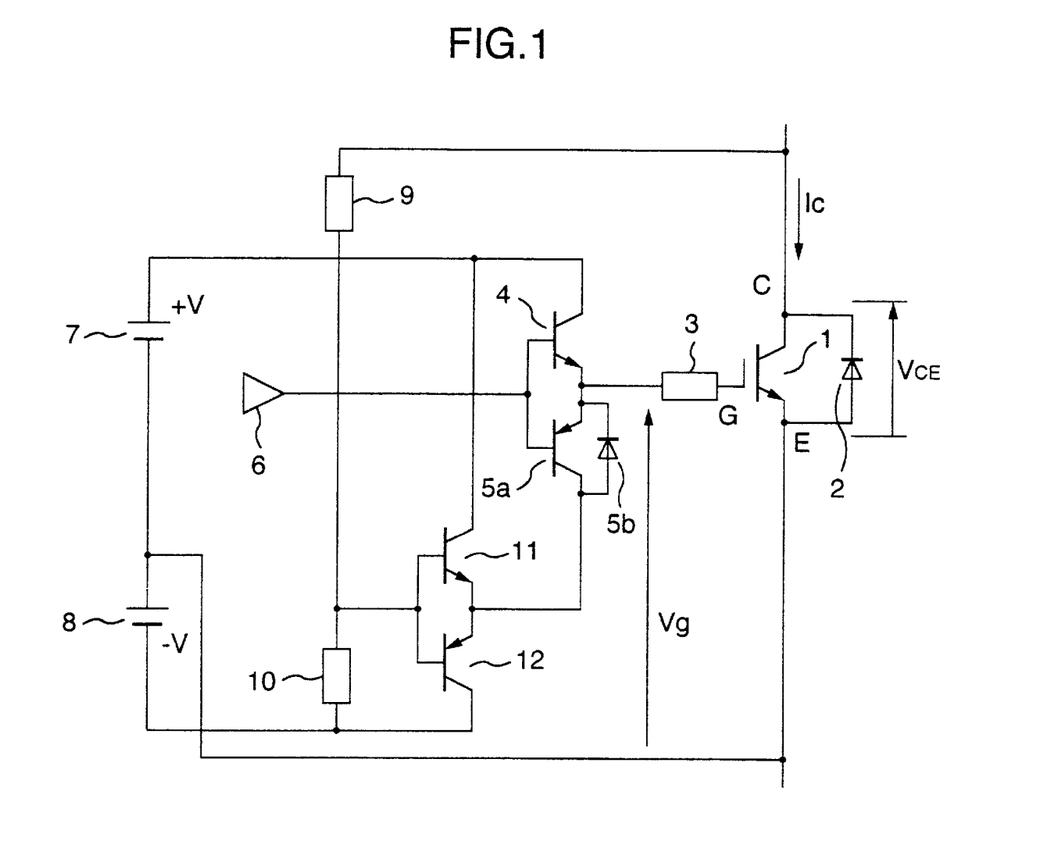
FIG. 1 is a circuit diagram for showing a first embodiment mode of a semiconductor power converting apparatus with employment of an insulated-gate transistor, according to the present invention.
Figure 2:
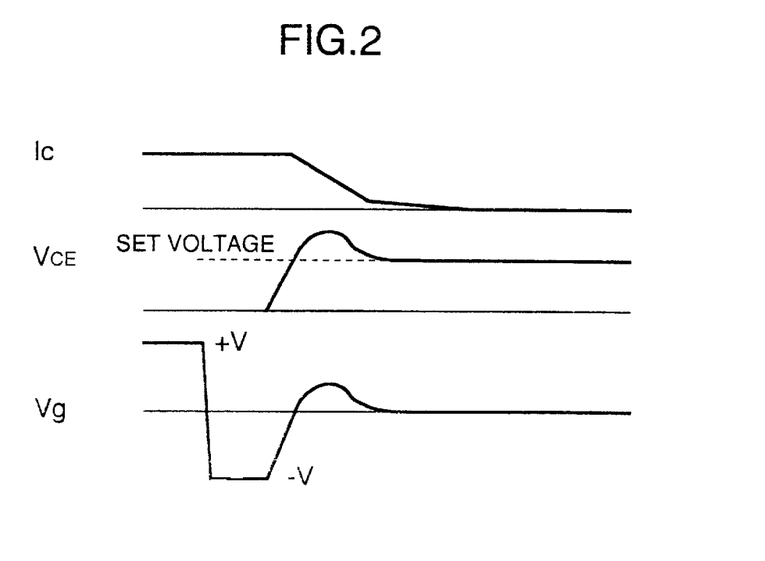
FIG. 2 is a diagram for explaining the first embodiment mode in which a $V_{CE}$ peak voltage during turn-OFF is suppressed by Vg responding to $V_{CE}$.
Figure 3:
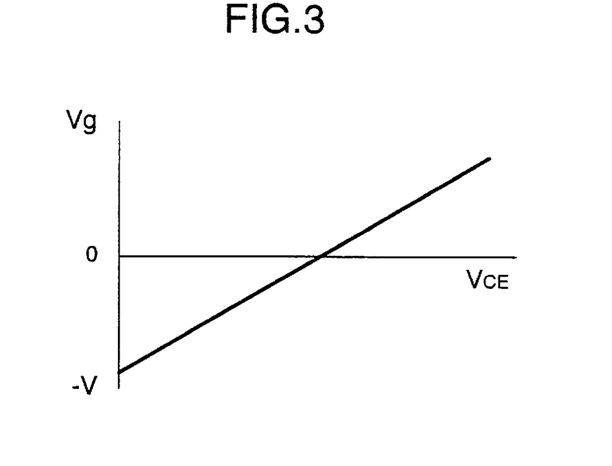
FIG. 3 is a diagram for explaining a relationship between $V_{CE}$ and Vg in the first embodiment mode.

FIG. 1, FIG. 2 and FIG. 3 are diagram for indicating a first embodiment mode of the present invention.

FIG. 1 represents an arrangement of a main circuit in unit of an arm. As indicated in this FIG. 1, in this embodiment mode, a cross-connected diode 2 is connected to an insulated-gate transistor 1, and both a transistor 4 and another transistor 5a are connected to a gate resistor 3. Then, both an ON command and an OFF command are supplied from a control circuit 6 to these transistors 4 and 5a. Also, a power supply 7 and another power supply 8 are provided so as to set bias voltages. As to a collector electrode C of the insulated-gate transistor 1 and a minus-polarity terminal of the power supply 8, a series member constituted by a resistor 9 and a resistor 10 is connected. A voltage appearing between the collector electrode C of the insulated-gate transistor 1 and the minus-polarity terminal of the power supply 8, which is divided by the resistor 9 and the resistor 10, is transferred by a transistor 11 and another transistor 12, and then is connected to a collector of a transistor 5a. The transistor 11 and the transistor 12 are connected in a complementary connection manner.

Referring now to FIG. 2 and FIG. 3, operations of this embodiment mode with the circuit arrangement as shown in this drawing will be explained. FIG. 2 graphically shows a collector current Ic when the insulated-gate transistor 1 is turned OFF, a voltage $V_{CE}$ between the collector and the emitter of the insulated-gate transistor 1, and also a gate voltage Vg indicated in FIG. 1. In the case that the ON signal is outputted from the control circuit 6, the transistor 4 of the power supply 7 is applied to the gate terminal of the insulated-gate transistor 1 via the gate resistor 3, so that this insulated-gate transistor 1 is brought into an ON state. When the insulated-gate transistor 1 is under ON state, since the voltage $V_{CE}$ of the insulated-gate transistor 1 is substantially equal to 0V, the voltage outputted from the complementary-connected transistors 11 and 12 becomes substantially equal to the voltage appearing on the minus-polarity terminal of the power supply 8. Under this condition, when the control circuit 6 outputs the OFF signal, the transistor 4 is turned OFF and the transistor 5a is turned ON. As a result, a reverse bias voltage is applied via the gate resistor 3 to the gate electrode of the insulated-gate transistor 1. This reverse bias voltage corresponds to the output voltage derived from the complementary-connected transistors 11 and 12, and is substantially equal to the voltage appearing on the minus-polarity terminal of the power supply 8. This reverse bias voltage may extract gate charges between the gate and the emitter of the insulated-gate transistor 1. The voltage $V_{CE}$ of the insulated-gate transistor 1 whose gate charges have been extracted starts to be increased. At this time, the voltage at the gate electrode is similarly increased in response to such a voltage obtained by dividing the voltage $V_{CE}$ by the resistors 9 and 10. Since this voltage dividing ratio of the resistor 9 and the resistor 10 is determined in such a manner that the gate voltage Vg is approximated to 0 V at a preset value of the voltage $V_{CE}$, when this voltage $V_{CE}$ is higher than, or equal to the set voltage, a forward bias voltage corresponding to this voltage $V_{CE}$ is applied to the gate electrode, so that an impedance between the collector and emitter of the insulated-gate transistor 1 may be decreased. As a result, a peak voltage of the voltage $V_{CE}$ may be suppressed. When the peak voltage of the voltage $V_{CE}$ is converged to a voltage near the set voltage, this voltage Vg is also converged to a voltage near zero V.

FIG. 3 graphically shows a relationship between $V_{CE}$ and Vg. A position on an abscissa where Vg becomes 0 and is intersected with $V_{CE}$ corresponds to a set voltage of $V_{CE}$. As explained above, the gate voltage "Vg" is substantially direct proportion to the voltage "$V_{CE}$". Insulated-gate transistor 1 is higher than, or equal to the set voltage, the peak voltage can be suppressed based upon the gate voltage Vg corresponding to the voltage $V_{CE}$. In connection thereto, the voltage utilization efficiency of the semiconductor element can be increased. Furthermore, such a compact semiconductor power converting apparatus can be operated in a high efficiency, while no longer the snubber circuit is required, or the snubber circuit can be operated under low capacity.

Figure 4:
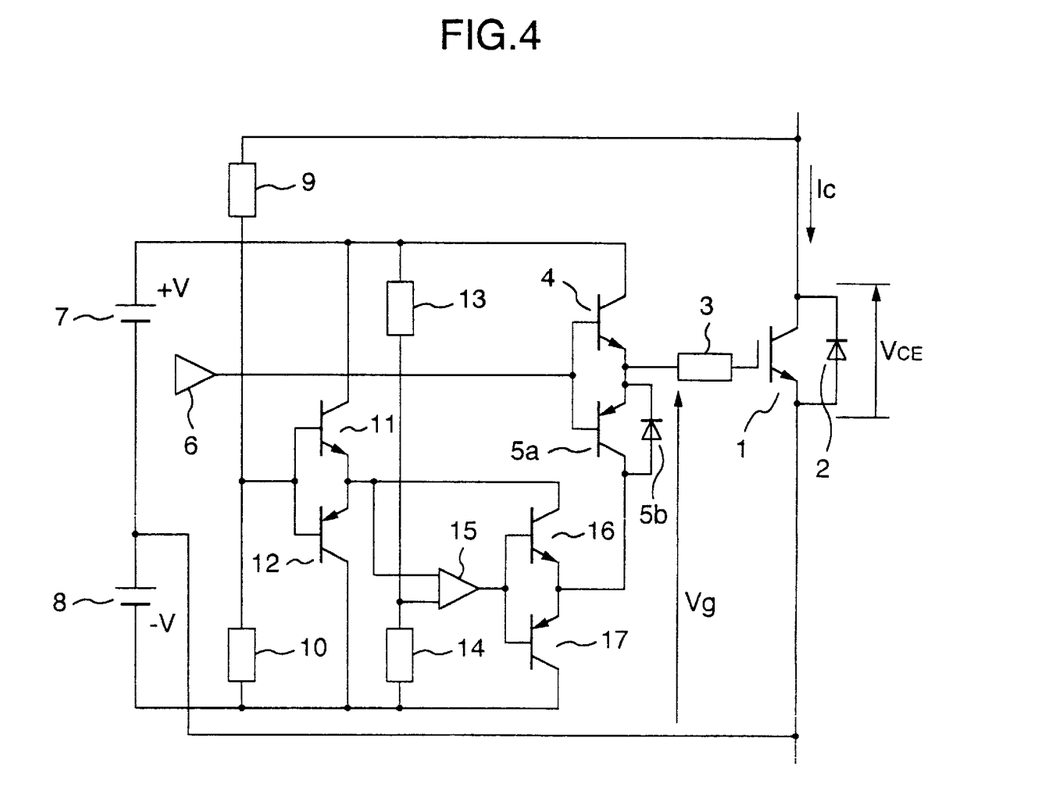
FIG. 4 is a circuit diagram for representing a second embodiment mode of the present invention.
Figure 5:
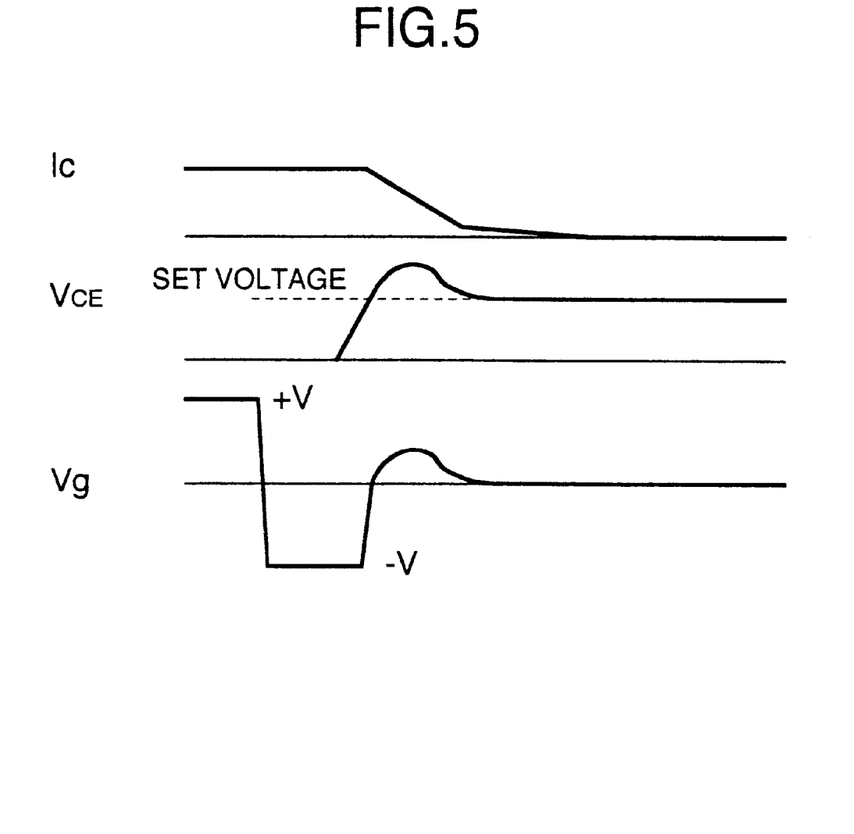
FIG. 5 is a diagram for explaining the second embodiment mode in which a $V_{CE}$ peak voltage during turn-OFF is suppressed by Vg responding to $V_{CE}$.

FIG. 4 and FIG. 5 indicate a second embodiment mode of the present invention.

It should be noted that the same reference numerals shown in FIG. 1 will be employed as those for denoting the same, or similar circuit elements used in the second embodiment mode shown in FIG. 4 and FIG. 5, and also other embodiment modes (will be discussed later), and therefore, descriptions thereof are omitted.

FIG. 4 represents an arrangement of a major circuit in unit of an arm. In this embodiment mode, a voltage detected by a detecting circuit having a similar circuit arrangement to that of the above-explained first embodiment mode is compared with a reference voltage decided by a resistor 13 and a resistor 14 in a comparator 15. The detecting circuit divides a voltage appearing between a collector of an insulated-gate transistor 1 and a minus-polarity terminal of a power supply 8. When a detected voltage is lower than, or equal to the reference voltage, the comparator 15 causes a transistor 16 to be turned OFF and another transistor 17 to be turned ON, so that this detected voltage becomes a reverse bias voltage corresponding to a power supply voltage "Vge" of the power supply 8. Also, when the detected voltage is higher than, or equal to the reference voltage, the comparator 15 outputs such a voltage responding to the detected voltage, and both the transistor 16 and the transistor 17 which are connected in a complementary manner will output a similar voltage. In this case, when the reference voltage is made substantially equal to the set voltage of the voltage $V_{CE}$, the gate voltage Vg can be applied as a forward voltage corresponding to the voltage $V_{CE}$ only when the voltage $V_{CE}$ becomes higher than, or equal to the set voltage.

Figure 6:
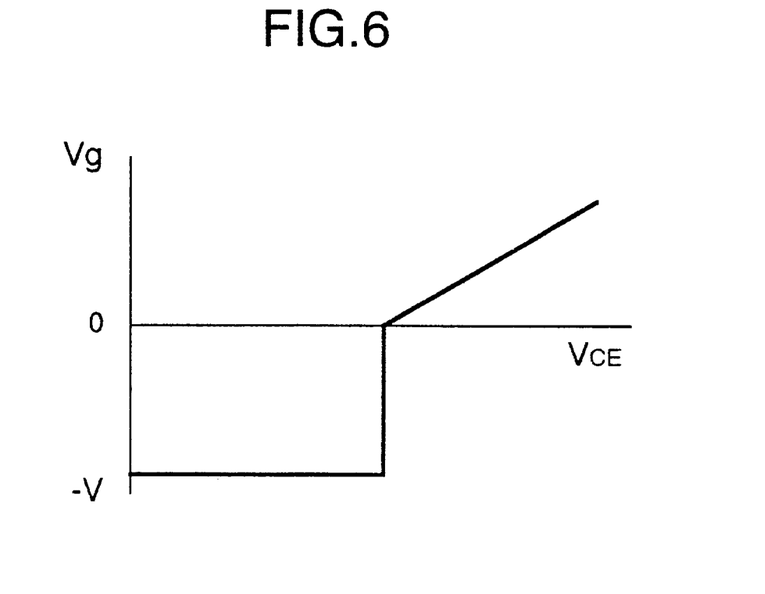
FIG. 6 is a diagram for explaining a relationship between $v_{CE}$ and Vg in the second embodiment mode.
Figure 7:
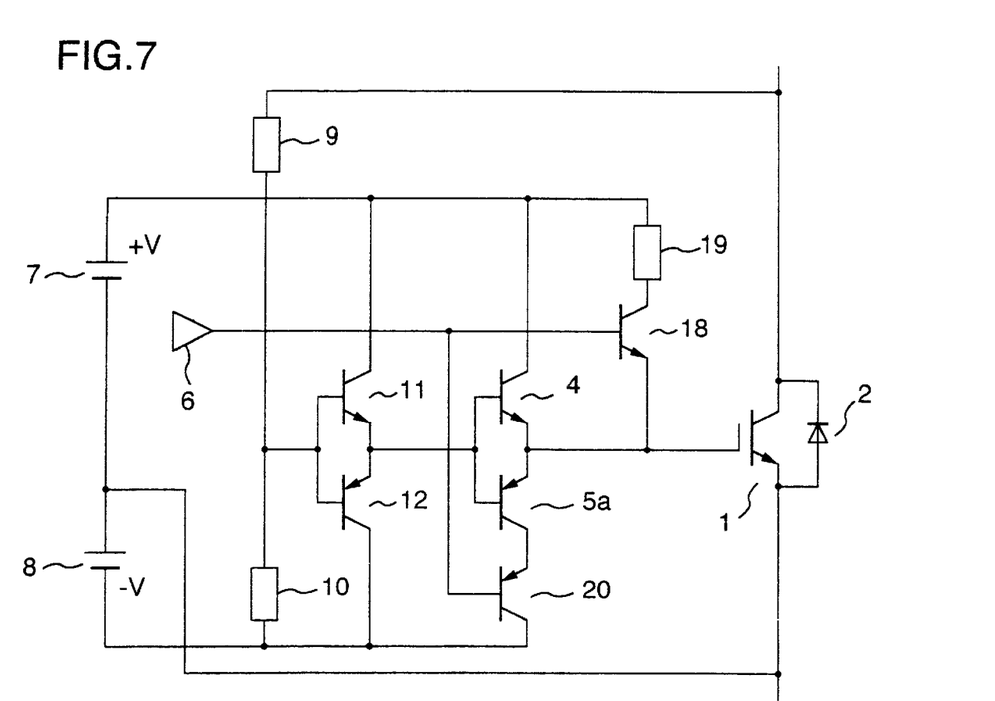
FIG. 7 is a circuit diagram for representing a third embodiment mode of the present invention.

Referring now to FIG. 5 and FIG. 6, operations of this embodiment mode with the circuit arrangement as shown in this drawing will be explained. FIG. 5 graphically shows a collector current Ic when the insulated-gate transistor 1 is turned OFF, a voltage $V_{CE}$ between the collector and the emitter of the insulated-gate transistor 1, and also a gate voltage Vg indicated in FIG. 4. In the case that the ON signal is outputted from the control circuit 6, the transistor 4 of the power supply 7 is applied to the gate terminal of the insulated-gate transistor 1 via the gate resistor 3, so that this insulated-gate transistor 1 is brought into an ON state. When the insulated-gate transistor 1 is under ON state, since the voltage $V_{CE}$ of the insulated-gate transistor 1 is substantially equal to 0 V, the voltage outputted from the complementary-connected transistors 11 and 12 becomes substantially equal to the voltage appearing on the minus-polarity terminal of the power supply 8. Under this condition, when the control circuit 6 outputs the OFF signal, the transistor 4 is turned OFF and the transistor 5a is turned ON. At this time, since the voltage divided by the resistor 9 and the resistor 10 is lower than, or equal to the reference voltage made by the resistor 13 and the resistor 14, the comparator 15 causes the transistor 17 to be turned ON, so that the gate voltage Vg is set as a reverse bias voltage equivalent to the voltage appearing on the minus-polarity terminal of the power supply 8. The gate charges appearing between the gate and the emitter of the insulated-gate transistor 1 are extracted by this reverse bias voltage. The voltage $V_{CE}$ of the insulated-gate transistor 1 whose gate electrodes have been extracted starts to be increased. While this voltage $V_{CE}$ is increased, the divided voltage by the resistor 9 and the resistor 10 is also increased. Under such a condition that the divided voltage is lower than or equal to the reference voltage produced by the resistor 13 and the resistor 14, the gate voltage Vg becomes such a reverse bias voltage corresponding to the power supply voltage of the power supply 8. Furthermore, in such a case that the voltage $V_{CE}$ is increased to become higher than, or equal to the reference voltage, the gate voltage Vg is set as a forward bias voltage in response to the voltage $V_{CE}$ by the comparator 15, and the insulated-gate transistor 1 causes the impedance changing ratio between the collector and the emitter to be lowered. As a result, the peak voltage of the voltage $V_{CE}$ is suppressed. When the peak voltage of the voltage $V_{CE}$ is converged to a voltage near the set voltage, this gate voltage Vg is also converged to a voltage near zero V. FIG. 7 graphically shows a relationship between $V_{CE}$ and Vg. When the gate voltage Vg is lower than, or equal to the set voltage of $V_{CE}$, this gate voltage Vg becomes a reverse bias voltage substantially equal to the power supply voltage of the power supply 8. When the gate voltage Vg is higher than, or equal to the set voltage, this gate voltage Vg is switched to higher than 0 V. When the voltage $V_{CE}$ becomes higher than, or equal to the set voltage, the gate voltage Vg becomes such a voltage which is substantially direct proportion to the set voltage. In accordance with this embodiment mode, when the voltage $V_{CE}$ of the insulated-gate transistor 1 is higher than, or equal to the set voltage, the peak voltage can be suppressed based upon the gate voltage Vg corresponding to the voltage $V_{CE}$. In connection thereto, the voltage utilization efficiency of the semiconductor element can be increased. When the voltage $V_{CE}$ is lower than, or equal to the set voltage, since the gate voltage Vg is set as the reverse bias voltage, the noise margin can be increased in order that the erroneous operations caused by the noise such as the error ignition do not occur. Furthermore, such a compact semiconductor power converting apparatus can be operated in a high efficiency, while no longer the snubber circuit is required, or the snubber circuit can be operated under low capacity.

FIG. 7 represents a third embodiment mode of the present invention. FIG. 7 shows an arrangement of the major circuit in unit of an arm. In this embodiment mode, a voltage detected by a detecting circuit having a similar circuit arrangement to that of the above-explained first embodiment mode is used to drive both a transistor 4 and a transistor 5a, which are connected in a complementary connection manner. This detecting circuit divides a voltage appearing between a collector of an insulated-gate transistor 1 and a minus-polarity electrode of a power supply 8. A series member constituted by a transistor 18 and a resistor 19 is connected in parallel to the transistor 4, and is driven by a control circuit 6. Also, another transistor 20 driven by the control circuit 6 is connected in series to the transistor 5a. In other words, both the transistor 4 and the transistor 18 establish a relationship of an OR logic gate circuit. The transistor 4 adjusts the gate voltage in response to the divided voltage. The transistor 18 is driven by the control circuit 6. Furthermore, both the transistor 5a and a transistor 20 establish a relationship of an AND logic gate circuit. The transistor 4 adjusts the gate voltage Vg in response to the divided voltage. The transistor 20 is driven by the control circuit 6. As a consequence, such an optimum gate resistor 19 when the insulated-gate transistor 1 is turned ON can be selected, and thus, the turn-ON loss can be reduced. Further, when the gate voltage Vg responding to the voltage $V_{CE}$ is outputted, the transistor 4 is directly connected to the gate of the insulated-gate transistor 1, so that the voltage $V_{CE}$ with respect to a change in the gate voltages Vg can be quickly controlled. In accordance with this embodiment mode, since the transistor for outputting the gate voltage in response to the voltage $V_{CE}$ and another transistor for normally turning ON the transistor is provided, it is possible to emphasize the suppression effect with respect to the peak voltage caused by the gate voltage Vg in response to the voltage $V_{CE}$ in such a case that this voltage $V_{CE}$ of the insulated-gate transistor 1 is higher than, or equal to the set voltage. In connection thereto, the voltage utilization efficiency of the semiconductor element can be increased. Furthermore, such a compact semiconductor power converting apparatus can be operated in a high efficiency, while no longer the snubber circuit is required, or the snubber circuit can be operated under low capacity.

Figure 8:
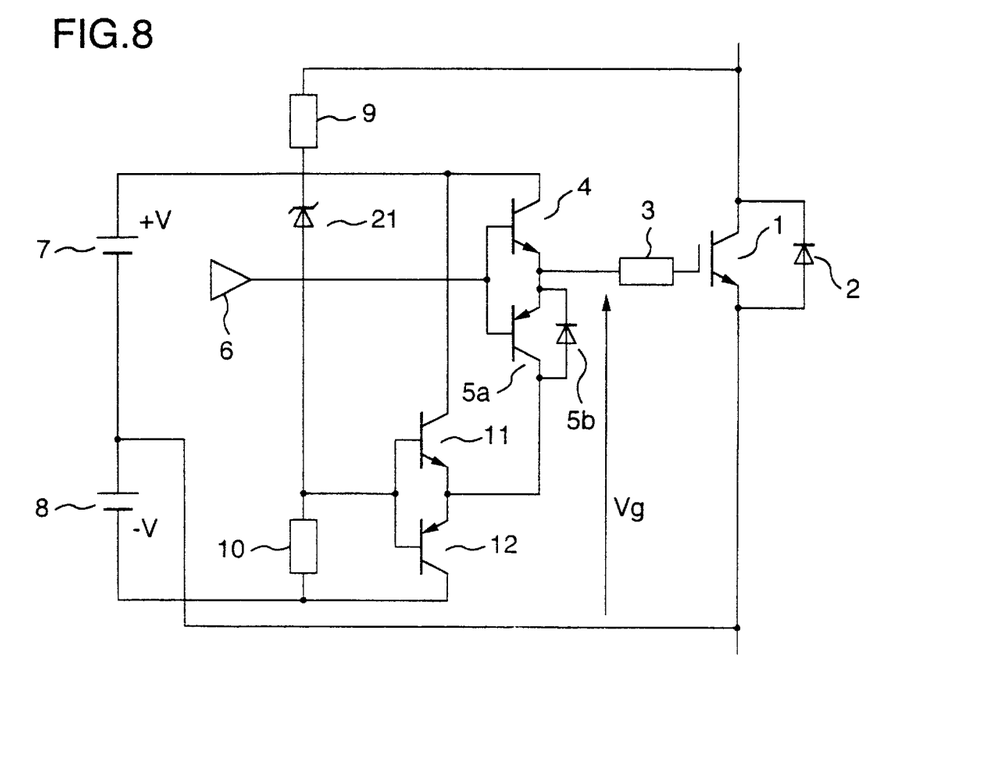
FIG. 8 is a circuit diagram for representing a fourth embodiment mode of the present invention.
Figure 9:
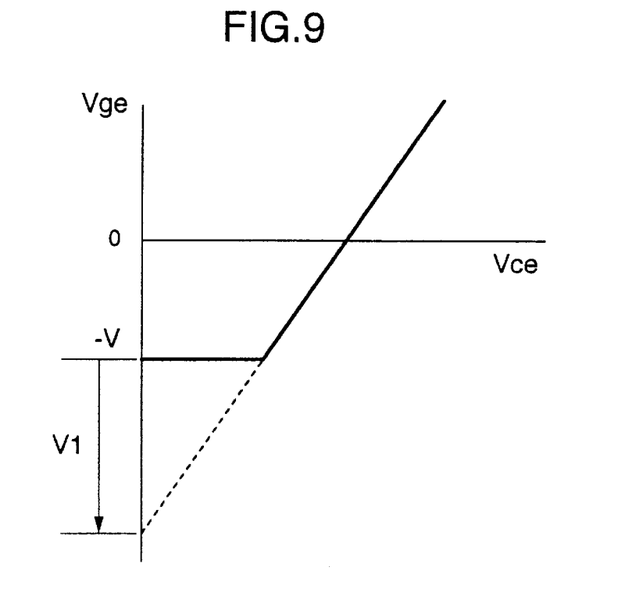
FIG. 9 is a diagram for explaining a relationship between $V_{CE}$ and Vg in the fourth embodiment mode.

FIG. 8 and FIG. 9 indicate a fourth embodiment mode of the present invention. FIG. 8 represents an arrangement of a major circuit in unit of an arm. In this embodiment mode, a peak voltage of an insulated-gate transistor 1 is suppressed by employing a similar circuit arrangement to that of the above-explained first embodiment mode, namely the gate voltage Vg is controlled by an output voltage from transistors 11 and 12 connected in a complementary manner. At this time, since a zener diode 21 is connected in series to a resistor 9, a changing ratio of the gate voltage Vg in the vicinity of the set voltage of $V_{CE}$ is increased. Assuming now that an avalanche voltage of the zener diode 21 is equal to "V1", this is equivalent to such a fact that V1 is added to the power supply voltage of the power supply 8. Alternatively, a voltage source may be connected in series to the resistor 9 instead of the zener diode. As a result, assuming now that a power supply voltage of a power source is equal to "V2", it is equivalent to such a fact that V2 is added to the power supply voltage of the power supply 8.

The operation of this embodiment mode with employment of the above-explained arrangement will now be described with reference to FIG. 9. FIG. 9 graphically shows a relationship between $V_{CE}$ and Vg. A position on an abscissa where Vg becomes 0 and is intersected with $V_{CE}$ corresponds to a set voltage of $V_{CE}$. This is equivalent to such a fact that the power supply voltage of the power supply 8 is increased by V1 by way of the zener diode, so that the changing ratio of the gate voltage Vg in the vicinity of the $V_{CE}$ set voltage is increased. In general, under such a condition that a voltage is lower than, or equal to a threshold voltage (3 to 6V) of Vge of an insulated-gate transistor, substantially no collector current Ic can flow through this transistor, and there is a small effect capable of reducing an impedance used to suppress a peak voltage. Accordingly, since the changing ratio of Vg with respect to $V_{CE}$ near the set voltage of $V_{CE}$ is increased, the convergence to the set voltage can be quickly performed. In accordance with this embodiment mode, when the voltage $V_{CE}$ of the insulated-gate transistor 1 is higher than, or equal to the set voltage, the peak voltage can be suppressed based upon the voltage Vg corresponding to the voltage $V_{CE}$. In connection thereto, the voltage utilization efficiency of the semiconductor element can be increased. In addition, since the converging speed to the set voltage can be increased, the switching frequency can be increased. Furthermore, such a compact semiconductor power converting apparatus can be operated in a high efficiency, while no longer the snubber circuit is required, or the snubber circuit can be operated under low capacity.

Figure 10:
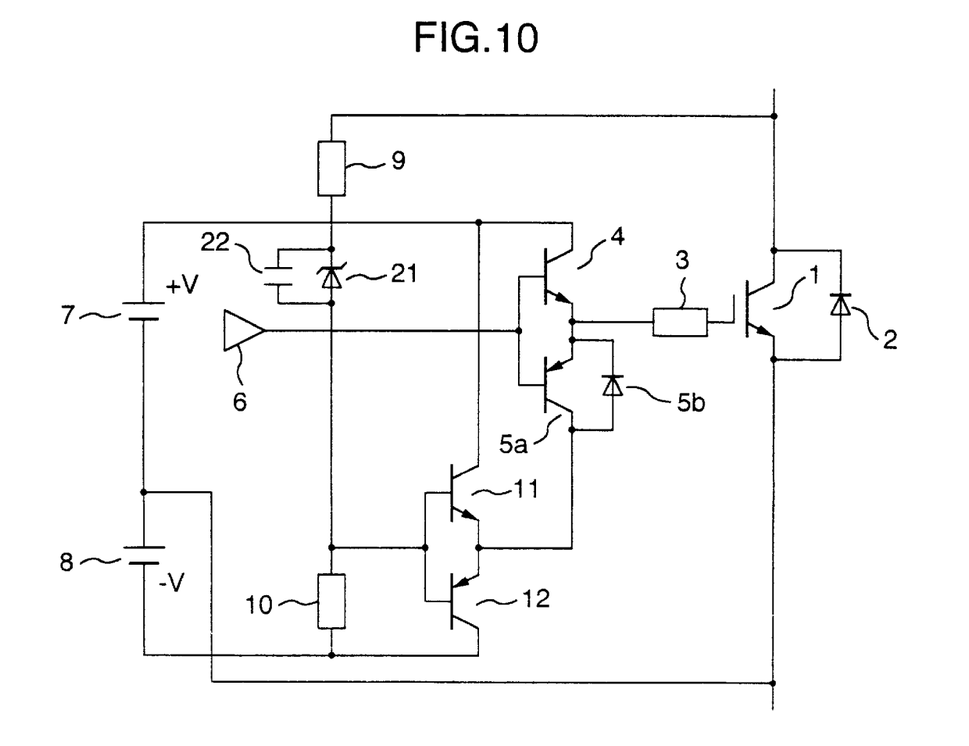
FIG. 10 is a circuit diagram for representing a fifth embodiment mode of the present invention.
Figure 11:
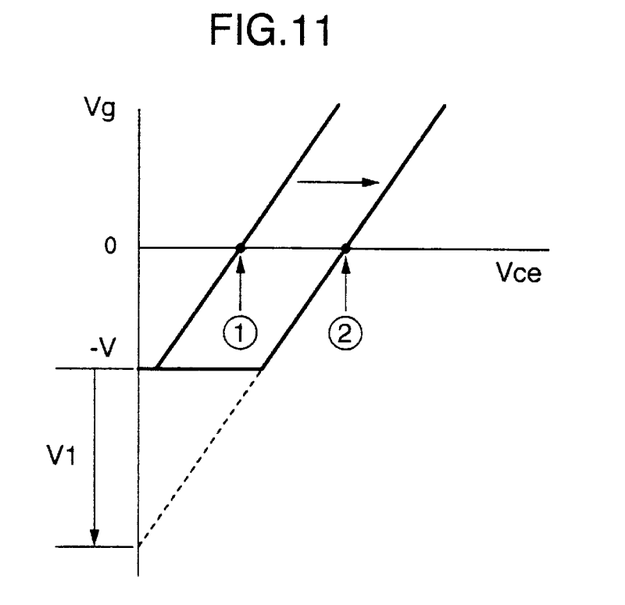
FIG. 11 is a diagram for explaining a relationship between $V_{CE}$ and Vg in the fifth embodiment mode.

FIG. 10 and FIG. 11 indicate a fifth embodiment mode of the present invention. FIG. 10 represents an arrangement of a major circuit in unit of an arm. In this embodiment mode, a capacitor 22 is connected in parallel to this zener diode 21 by employing a similar circuit arrangement to that of the above-explained fourth embodiment mode, namely the resistor 9 is connected in series to the zener diode 21. Since the capacitor 22 is connected to this zener diode, when the voltage $V_{CE}$ after the IGBT is turned OFF rises up, the zener diode 21 cannot be quickly reached to the avalanche voltage due to charging operation of the capacitor 22. As a result, while the divided voltage produced by the collector of the insulated-gate transistor and the power supply 8 is lower than, or equal to the $V_{CE}$ set voltage under avalanche condition of the zener diode 21, the gate voltage Vg is set as a forward bias voltage. Since the capacitor 22 is gradually charged, the relationship between $V_{CE}$ and Vg is varied. At such a time instant when the capacitor 22 is charged up to the avalanche voltage of the zener diode 21, the voltage $V_{CE}$ becomes a predetermined set value and becomes stable. Since the capacitance of the capacitor 22 is selected to a proper capacitance value, the effect for suppressing the peak voltage can be improved.

Referring now to FIG. 11, a description will be made of operations of this embodiment mode with employment of the above-explained circuit arrangement.

FIG. 11 graphically shows a relationship between $V_{CE}$ and Vg. A position on an abscissa where Vg becomes 0 and is intersected with $V_{CE}$ corresponds to a set voltage of $V_{CE}$. When the voltage $V_{CE}$ starts to rise up, no charge is stored in the capacitor 22, and the voltage of the zener diode is equal to 0 V. As a result, the original $V_{CE}$ set voltage is equivalent to such a voltage condition that this set voltage is lower than, or equal to a predetermined voltage $V_{CE}$. The capacitor 22 is gradually charged up to the voltage of the zener diode 21. In connection thereto, the set voltage of $V_{CE}$ is gradually increased, and then is reached up to a preselected original set voltage. As to the impedance of the insulated-gate transistor 1, since there are small amounts of a delay defined after the voltage $V_{CE}$ is detected and until the gate voltage Vg is controlled, and another delay with respect to the gate voltage Vg, if the set voltage when the voltage $V_{CE}$ rises up is suppressed to a lower voltage, then the peak suppressing effect can be improved. In accordance with this embodiment mode, even when dv/dt is high, the peak voltage suppressing effect can be emphasized by the gate voltage Vg in accordance with the voltage $V_{CE}$ in such a case that the voltage $V_{CE}$ of the insulated-gate transistor 1 is higher than, or equal to the set voltage in such a form that both the delay in the circuit operation and the response delay of the insulated-gate transistor 1 with respect to the gate voltage Vg can be compensated. Furthermore, such a compact semiconductor power converting apparatus can be operated in a high efficiency, while no longer the snubber circuit is required, or the snubber circuit can be operated under low capacity.

Figure 12:
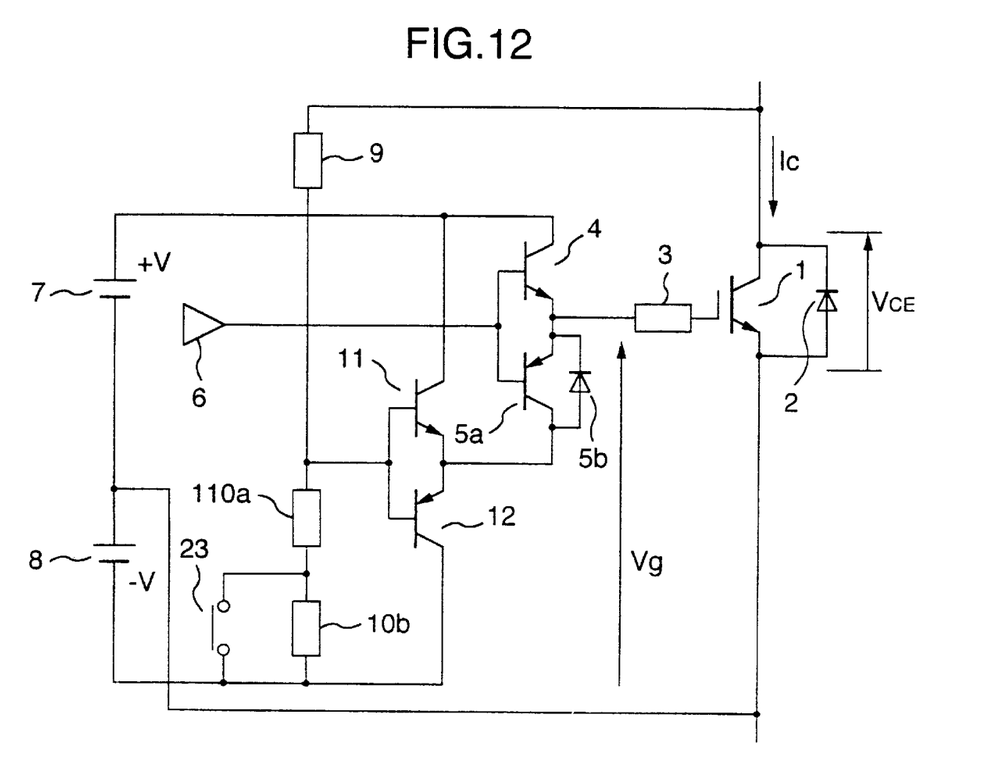
FIG. 12 is a circuit diagram for representing a sixth embodiment mode of the present invention.
Figure 13:
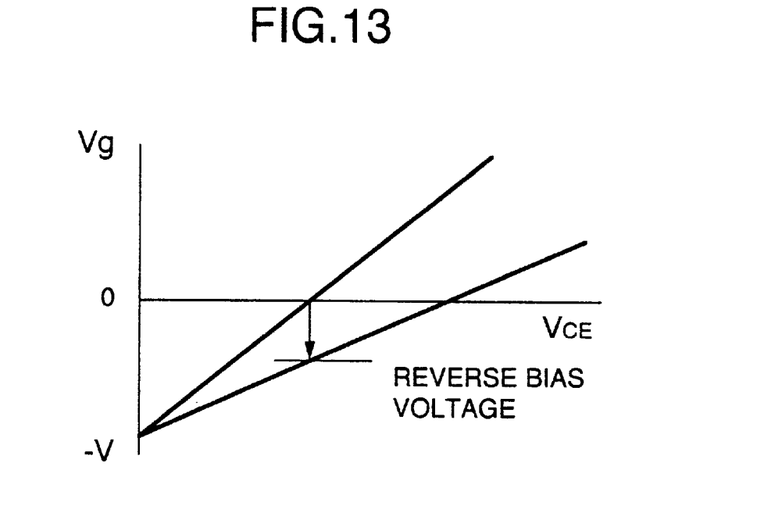
FIG. 13 is a diagram for explaining a relationship between $V_{CE}$ and Vg in the sixth embodiment mode.
Figure 14:
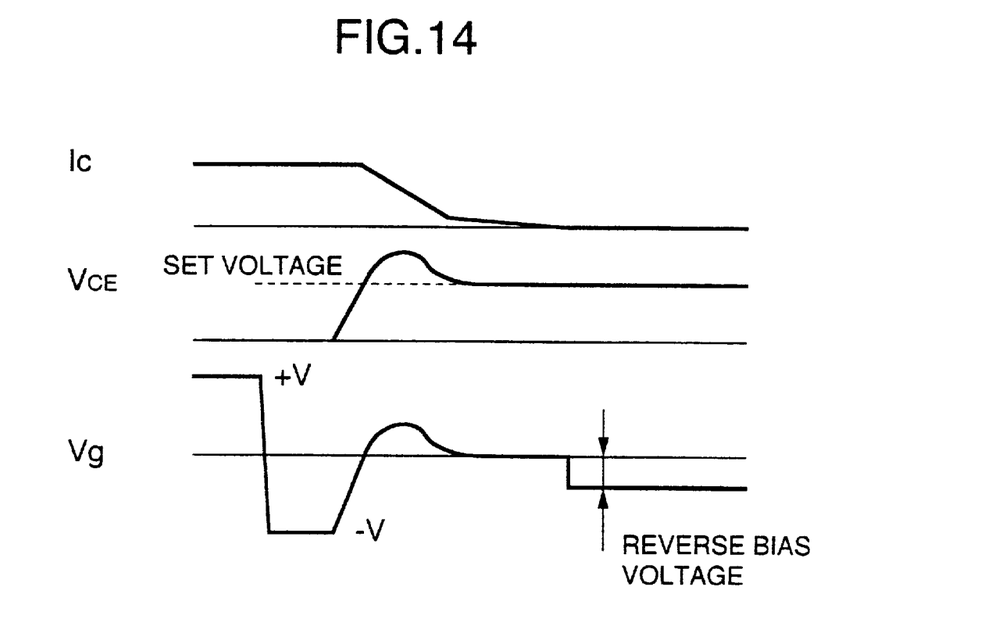
FIG. 14 is a diagram for explaining the second embodiment mode in which a $V_{CE}$ peak voltage during turn-OFF is suppressed by Vg responding to $V_{CE}$.

FIG. 12, FIG. 13 and FIG. 14 are diagram for indicating a sixth embodiment mode of the present invention.

FIG. 12 represents an arrangement of a main circuit in unit of an arm. Similar to the circuit arrangement of the first embodiment mode, a resistor 10 used to divide a voltage appearing between a collector of an insulated-gate transistor 1 and a minus-polarity terminal of a power supply 8 is subdivided into a resistor 10a and another resistor 10b. A switch 23 is connected in parallel to the resistor 10b. The switch 23 is brought into an OFF state immediately after the insulated-gate transistor 1 is turned OFF, and a $V_{CE}$ set voltage set by the resistor 9 and the resistors 10a and 10b is brought into a predetermined condition. After a peak voltage by turning OFF the insulated-gate transistor 1 is converged up to the power supply voltage, the switch 23 is turned ON, so that the resistor 10b is shortcircuited. As a result, the set voltage with respect to the voltage $V_{CE}$ is changed into a higher set voltage. Since the $V_{CE}$ set voltage is set to such a higher set voltage, the gate voltage Vg becomes a reverse bias voltage of several V, so that the noise margin with respect to the erroneous ignition operation can be increased.

The operation of this embodiment mode with employment of the above-explained arrangement will now be described with reference to FIG. 13 and FIG. 14. FIG. 13 graphically shows a relationship between $V_{CE}$ and Vg. Immediately after the insulated-gate transistor is turned OFF, the relationship between $V_{CE}$ and Vg is a relationship (1) of FIG. 13, and the peak voltage is converged to a set voltage corresponding to the power supply voltage. After a preselected time period has passed when the voltage $V_{CE}$ is converged to the power supply voltage, the switch 23 is turned ON. As a result, the relationship between $V_{CE}$ and Vg may be changed into another relationship (2) of FIG. 13. At this time, since the voltage $V_{CE}$ is stabilized at the power supply voltage, only the gate voltage Vg is lowered by several V, so that a reverse bias voltage of several V may be applied. FIG. 14 indicates such a condition that after the voltage $V_{CE}$ has been converged to the set voltage, the switch 23 is turned ON and therefore, a reverse bias voltage of several V is applied. In accordance with this embodiment mode, while the insulated-gate transistor 1 is turned OFF, the noise margin can be increased in order that the erroneous ignition operations do not occur without employing a complex circuit. Furthermore, such a compact semiconductor power converting apparatus can be operated in a high efficiency, while no longer the snubber circuit is required, or the snubber circuit can be operated under low capacity.

Figure 15:
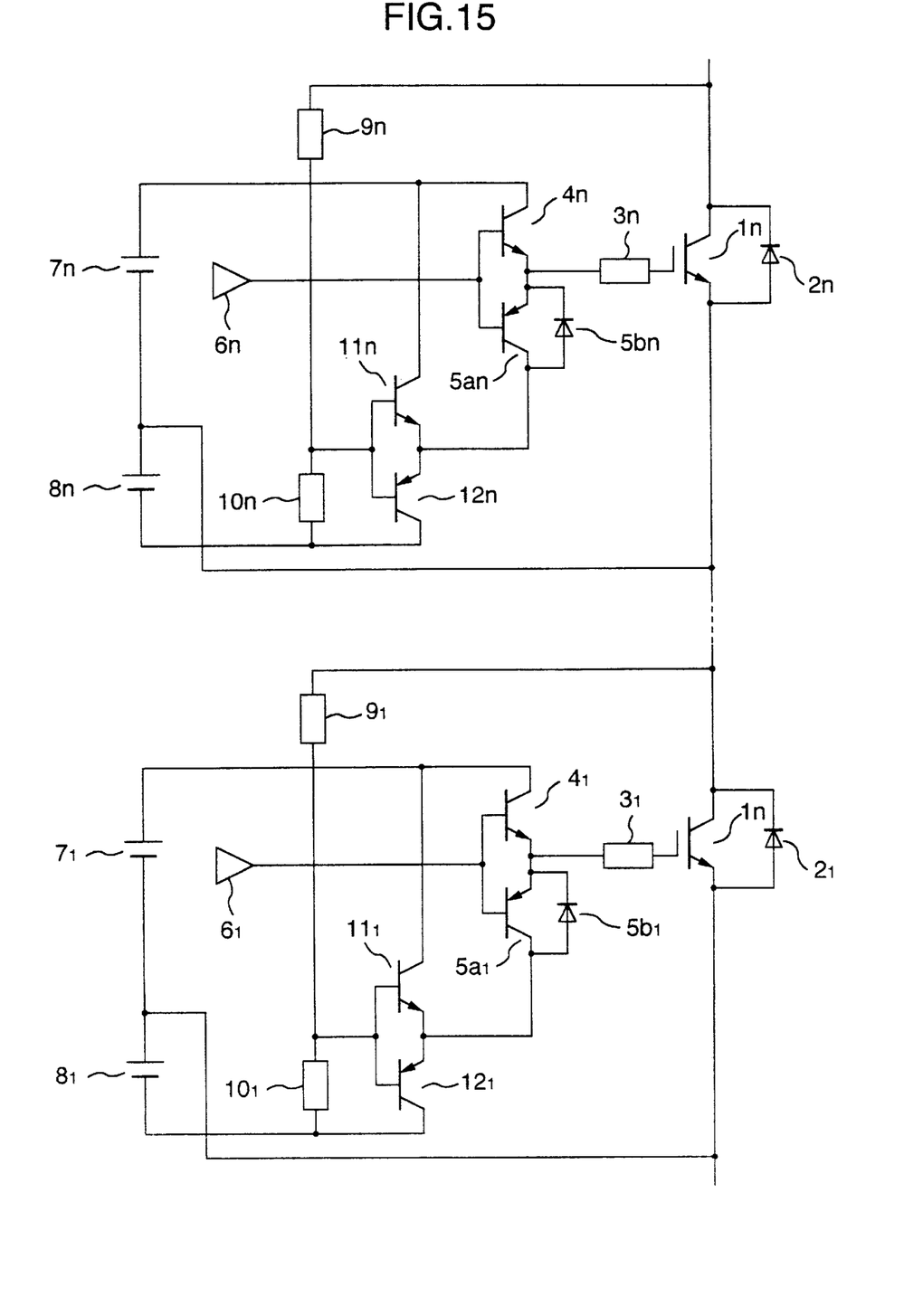
FIG. 15 is a circuit diagram for representing a seventh embodiment mode of the present invention.

FIG. 15 represents a seventh embodiment mode of the present invention.

FIG. 15 shows a circuit arrangement of a main circuit in unit of an arm, in which "n" pieces of insulated-gate transistors are series-connected to each other, and are turned ON, or OFF at the same time. In this embodiment mode, these insulated-gate transistors 11 to 1n constitute a similar arrangement to that of the first embodiment mode, which divides a voltage appearing between collectors thereof and minus-polarity terminals of power supplies 81 to 8n. Each of these insulated-gate transistors 11 to in which are simultaneously turned OFF by control circuits 61 to 6n may suppress a peak voltage in a similar manner to that of the first embodiment mode. Also, since each of these insulated-gate transistors is converged from the peak voltage to a set voltage $V_{CE}$, the set value of the voltage $V_{CE}$ is made equal to such a voltage produced by equally sharing a DC power supply voltage by "n" pieces of series-connected transistors. As a result, the power supply voltage can be equally divided. In general, the respective insulated-gate transistors which are series-connected to each other own different ground capacitances from each other, and further own different circuit characteristics and different element characteristics from each other. Therefore, a snubber circuit for equally dividing voltages, and also a gate timing controller are required. However, in accordance with this embodiment mode, each of these insulated-gate transistors can suppress the peak voltage, and also the power supply voltage can be equally shared by these insulated-gate transistors by converging the voltage to a predetermined voltage $V_{CE}$. In connection thereto, the voltage utilization ratio of the semiconductor elements can be increased. Also, since the voltage is converged to a predetermined voltage $V_{CE}$, the snubber circuit is no longer required, or can be operated with a low capacity. Therefore, such a compact semiconductor power converting apparatus operable in a high efficiency can be provided without requiring the selections of the circuits/elements, and the fine adjustment.

Also, in FIG. 15, the circuit for constituting the arm is constituted similar to that of the first embodiment mode. Apparently, the circuit arrangements of the above-explained embodiment modes other than this first embodiment mode may be applied to the circuit for constituting the arm.

As previously explained in detail, in accordance with the present invention, the peak voltage can be suppressed. In connection thereto, the voltage utilization efficiency of the semiconductor element can be increased. Furthermore, since the snubber circuit is omitted, the snubber loss can be reduced. Therefore, the electric power converting apparatus can be made compact and operable in a high efficiency. Also, the semiconductor power converting apparatus can be made in low cost.

Also, in accordance with the present invention, the suppression effect of the peak voltage can be improved. In connection thereto, the voltage utilization ratio of the semiconductor element can be increased. Moreover, since the converging speed to the set voltage can be shortened, it is possible to provide such a semiconductor power converting apparatus whose switching frequency is set to the high switching frequency.

What is claimed is:

1. A semiconductor power converting apparatus comprising:

an insulated-gate transistor for controlling a current flowing through a collector and an emitter in response to a gate condition;

a driving circuit connected to said gate inputting a drive signal;

voltage applying means for applying both a forward bias and a reverse bias to the gate as set the emitter of said insulated-gate transistor to a neutral potential;

voltage dividing means for dividing a voltage appearing between the collector of said insulated-gate transistor and the emitter thereof, or a voltage appearing between the collector of said insulated-gate transistor and a minus-sided electrode of said voltage source by employing resistors, in which when said drive signal is an OFF command, a gate voltage of said insulated-gate transistor is brought into such a voltage condition corresponding to the voltage division; and switching means for switching the gate voltage in such a manner that said gate voltage is equal to a negative voltage corresponding to the source voltage of said voltage source when the divided voltage detected by said voltage dividing means is lower than, or equal to a set voltage, and also said gate voltage is equal to a voltage value produced based upon the divided voltage when the divided voltage by said voltage means is higher than, or equal to the set voltage.

2. A semiconductor power converting apparatus as claimed in claim 1 wherein:

while said voltage dividing means employs either zener diode or a voltage source in order that a voltage changing ratio of the gate signal to the collector potential of the insulated-gate transistor, said voltage dividing means can suppress a peak voltage appearing between the collector and the emitter based upon a gate voltage in response to the voltage between the collector and the emitter in such a case that the voltage between the collector and the emitter of said insulated-gate transistor is higher than, or equal to a predetermined voltage.

3. A semiconductor power converting apparatus as claimed in claim 1 wherein:

said voltage dividing means changes a voltage dividing ratio in such a manner that a relationship between the gate voltage and the collector potential can be continuously, or stepwise changed, and rising of the collector potential is commenced; and said voltage dividing means can suppress a peak voltage appearing between the collector and the emitter based upon a gate voltage in response to the voltage between the collector and the emitter in such a case that the voltage between the collector and the emitter of said insulated-gate transistor is higher than, or equal to a predetermined voltage.

4. A semiconductor power converting apparatus as claimed in claim 1 wherein:

said voltage dividing means reverse-biases a gate signal by times means for changing the voltage dividing ratio for a predetermined time period after the drive signal is switched On to OFF.

5. A semiconductor power converting apparatus as claimed in claim 1 wherein:

more than 2 sets of said semiconductor elements are connected in series to each other so as to constitute an arm;

said voltage dividing means owned by each of said insulated-gate transistors sets the voltage dividing ratio to such a voltage value obtained by dividing a voltage applied to the arm by a total number of said series-connected insulated-gate transistors of the arm; and when a voltage appearing between the collector and the emitter of each of said insulated-gate transistors is higher than, or equal to a predetermined voltage, the gate voltage of said insulated-gate transistor is made a voltage state corresponding to the divided voltage.

* * * * *